(12) United States Patent
Dagens et al.

(10) Patent No.: US 6,215,935 B1
(45) Date of Patent: Apr. 10, 2001

(54) OPTICAL COMPONENT BASED ON SEMI-CONDUCTOR OPTICAL AMPLIFIERS HAVING A REDUCED NUMBER OF INDEPENDENT ELECTRODES

(75) Inventors: Beatrice Dagens, Paris; Christopher Janz, Issy les Moulineaux, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/443,454

(22) Filed: Nov. 19, 1999

(30) Foreign Application Priority Data

Nov. 24, 1998 (FR) .................................................. 98 14803

(51) Int. Cl.$^7$ ...................................................... G02B 6/10
(52) U.S. Cl. .................. 385/131; 385/2; 385/8; 385/40; 385/45; 385/14
(58) Field of Search .............................. 385/131, 40, 129, 385/133, 14, 8, 122, 2, 45, 39; 359/326, 332

(56) References Cited

U.S. PATENT DOCUMENTS

| | | |
|---|---|---|
| 5,146,518 | 9/1992 | Mak et al. .............................. 385/41 |
| 5,150,436 | 9/1992 | Jaeger et al. .............................. 385/2 |
| 6,005,708 | * 12/1999 | Leclerc et al. ......................... 359/362 |
| 6,035,078 | * 12/1999 | Dagens et al. .......................... 385/14 |

FOREIGN PATENT DOCUMENTS

| | | |
|---|---|---|
| 06273816 | 9/1994 | (JP) . |
| 10223989 | 8/1998 | (JP) . |

\* cited by examiner

Primary Examiner—Phan T. H. Palmer
(74) Attorney, Agent, or Firm—Sughrue, Mion, Zinn, Macpeak & Seas, PLLC

(57) ABSTRACT

The invention relates to an optical component based on semi-conductor optical amplifiers in which the number of independent electrodes is reduced. The component has different regions (1, 2, 3, 4, 5) with the same vertical structure wherein an active waveguide (20) is buried between the upper and lower buffer layers. These regions each have lower and upper electrodes (10, $E_2$, $E_4$) for the purpose of injecting into them equal or different values of current density. This component is characterized in that at least one (10) of the said electrodes covers a number of regions (1, 3, 5) and has distributed resistivity which is adjusted depending on the region under consideration.

8 Claims, 3 Drawing Sheets

OPTICAL COMPONENT BASED ON SEMI-CONDUCTOR OPTICAL AMPLIFIERS HAVING A REDUCED NUMBER OF INDEPENDENT ELECTRODES

BACKGROUND OF THE INVENTION

The invention lies in the field of semi-conductor optical components used for optical transmission or for methoding of digital optical data.

It more particularly relates to all optical components having a number of semi-conductor optical amplifiers, known in what follows as "SOA" (for "Semiconductor optical amplifier" in the Anglo-Saxon literature), such as for instance wavelength shifters, multi-arm amplifiers, all-optical switches or multiplexers.

To simplify the exposition of the invention, in what follows mention will be made only of all-active wavelength shifters, the subject matter of the invention also extending, as has been said, to all optical components based on a number of SOA.

Wavelength shifters are used in the field of telecommunications to shift a transmitted optical signal from one wavelength to another wavelength while maintaining its characteristics. Such changes of wavelength are used in particular during routing of signals to resolve problems of contention.

In such shifters the information is in the form of binary data represented by pulses modulating an optical carrier wave. A binary value is therefore determined dependent on the level of amplitude (or of power) of the modulated optical wave.

A common method of producing all-optical wavelength shifters is to use an interferometric structure of Mach-Zehnder type or equivalent.

An interferometric structure of this type is shown in plan view in FIG. 1. It is made up of two guiding branches 1 and 2. At least one of these branches is equipped with a semi-conductor optical amplifier $SOA_1$. However in general it is preferred to position a second semi-conductor optical amplifier $SOA_2$ on the other guiding branch for reasons of symmetry. This is because the presence of a second semi-conductor optical amplifier $SOA_2$ makes it possible to maintain substantially the same level of amplification in the two branches and thus to have substantially identical power at the output from the branches of the interferometer.

A first coupler $K_1$ allows one end of each of these branches to be coupled to a peripheral semi-conductor optical amplifier, also called input amplifier $SOA_5$. In a counter-directional functional configuration, an external laser source 7 also enables the supply to this amplifier $SOA_5$ an output carrier wave M of wavelength $\lambda s$.

A second coupler $K_1$ is disposed so as to couple the other end of branch 1 to another peripheral semiconductor optical amplifier $SOA_4$. This coupler $K_2$ enables introduction into the first amplifier $SOA_1$, of an input signal E of wavelength $\lambda e$ which has been amplified by the input amplifier $SOA_4$.

A third coupler $K_3$, connected to coupler $K_2$, to the second amplifier $SOA_2$ and to another peripheral semi-conductor optical output amplifier $SOA_3$, is disposed in such a way as to supply an output signal resulting from the coupling of auxiliary waves $AM_1$, and $AM_2$ supplied respectively by the first and second amplifiers $SOA_1$ and $SOA_2$.

Waves $AM_1$, and $AM_2$ correspond to waves $M_1$ and $M_2$ output from the coupler $K_1$ amplified respectively by amplifiers $SOA_1$ and $SOA_2$. The output signal S, of wavelength $\lambda s$, is then amplified by the peripheral output amplifier $SOA_3$. It results from constructive or destructive interference of the waves $AM_1$, and $AM_2$, depending on the phase difference between the two branches 1 and 2 of the interferometer.

Another peripheral amplifier $SOA_6$ is also provided to maintain the symmetry of the structure and to enable replacement of one of the amplifiers $SOA_3$ or $SOA_4$ in case of any breakdown.

Amplification currents are injected respectively into the amplifiers $SOA_1$, $SOA_2$, $SOA_3$, $SOA_4$, and $SOA_5$ by means of electrodes $E_1$, $E_2$, $E_3$, $E_4$, and $E_5$. To make this type of interferometric structure operate it is therefore necessary to use five independent electrodes $E_1$, $E_2$, $E_3$, $E_4$, $E_5$, and five different current sources are necessary to inject an amplification current on each electrode. On the other hand, in a component with equivalent active/passive structure, only three current sources are necessary to make it work. This is because in this case the waveguides 3 and 5 are passive, so that it is not necessary to position electrodes above these guides to amplify the signal.

SUMMARY OF THE INVENTION

The problem which the invention sets out to solve thus consists in reducing the number of independent electrodes in all-active components based on a number of semi-conductor optical amplifiers, in order to reduce the number of current sources necessary to control them. Such a reduction in the number of current sources will make it possible to simplify the use of this type of component and to facilitate its insertion into optical telecommunications systems.

To this end, the invention provides more particularly a semi-conductor optical component having different regions with the same vertical structure, wherein an active waveguide is buried between the lower and upper buffer layers, the said regions having upper and lower electrodes to enable injection of equal or varying values of current density, characterized in that at least one of the said electrodes covers several different regions and has distributed transverse resistivity which is adjusted according to the region under consideration.

According to another characteristic of the invention, the upper electrodes are constituted by a contact layer on which is deposited a metallization layer, and the transverse resistivity of the electrode common to a number of regions is adjusted, depending on the region under consideration, by locally interrupting the contact layer. The local interruptions of this layer are for example realized by engraving over a width at least identical to that of the active waveguide.

According to another characteristic of the invention, the metallization layer of the common electrode is also interrupted locally, by engraving, over a width at least identical to that of the active waveguide and less than that of the said common electrode.

According to another characteristic of the invention, the upper electrodes are constituted of a doped contact layer on which is deposited a metallization layer, and the transverse resistivity of the electrode common to a number of regions is adjusted, depending on the region under consideration, by local modification of the doping of the contact layer. This local modification of the doping is realized, for example, by ion implantation over a width at least identical to that of the active waveguide.

According to another characteristic of the invention, the optical component is an all-active wavelength shifter.

According to yet another characteristic of the invention, this wavelength shifter has an electrode common to a guiding branch, to an input, and to an output; and two control electrodes covering respectively another guiding branch and another input.

Thanks to the invention it is possible to reduce the number of independent electrodes in an optical component, specifically in an all-active component. In the example of an all-active wavelength shifter this number of independent electrodes is reduced from five to three. This reduction in the number of electrodes makes it possible to reduce the number of current sources necessary to the functioning of the component and consequently to facilitate the use of the component and its insertion into an optical telecommunication system.

BRIEF DESCRIPTION OF THE DRAWINGS

Other particular features and advantages of the invention will be seen upon reading the description given as an illustrative but not exhaustive example and given with reference to the appended figures, which show.

DETAILED DESCRIPTION OF THE INVENTION

Figure 1:
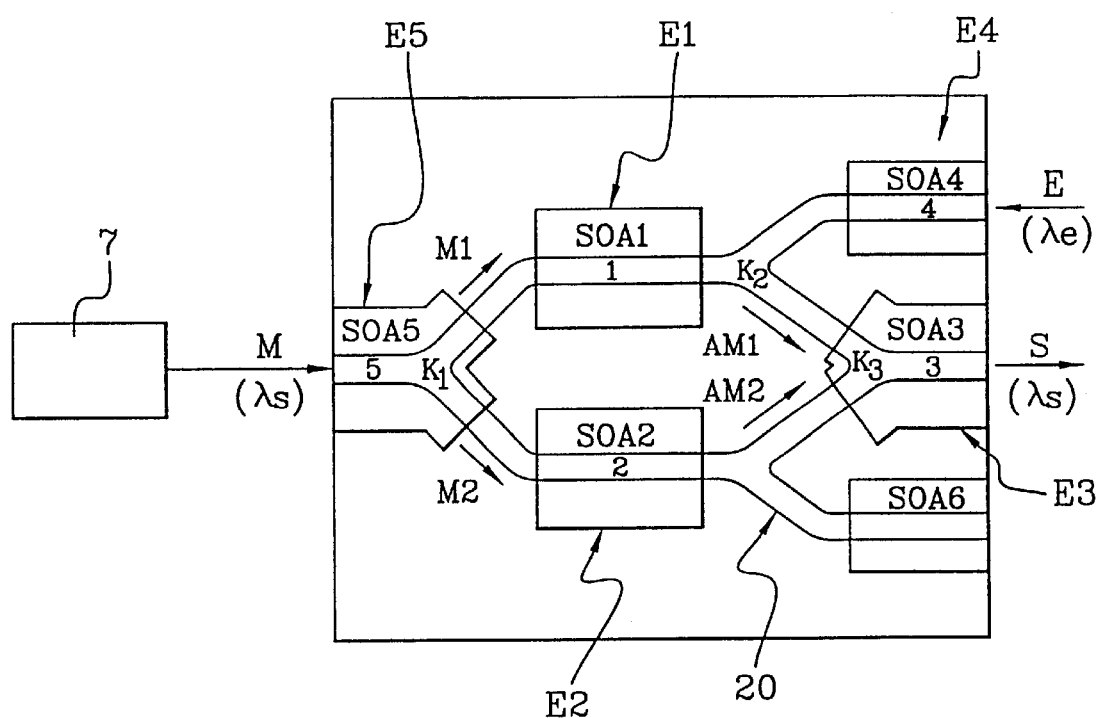
FIG. 1, described above, a plan view of a conventional all-active wavelength shifter, FIG. 2, a plan view of an embodiment of an all-active wavelength shifter according to the present invention, FIG. 3, a longitudinal section A—A of FIG. 2.

The example of an all-active wavelength shifter shown in FIG. 1 has already been described in its essentials in the introduction above. Such a component consists of five different regions 1, 2, 3, 4, 5 corresponding to the two guiding branches and to the inputs and output. These regions have the same vertical structure. They more particularly have an active layer configured in the form of an active waveguide 20 which is confined between the lower and upper buffer layers. The regions of the component differ simply by the fact that they each have an upper and a lower electrode. The upper electrodes of each region 1, 2, 3, 4 and 5 are respectively referenced $E_1$, $E_2$, $E_3$, $E_4$, and $E_5$ in FIG. 1. The electrodes of these regions are independent. They are polarized and allow the injection of a certain value of current density, also called transverse pumping current, through the active layer constituting the waveguide 20. The value of the pumping currents injected on each independent electrode may be different, and the density of carriers circulating in the region of the waveguide 20 situated below each electrode may also be different.

In practice it has been observed that the proportions between the current densities circulating respectively in the regions of the guiding branch 1, the input 5 and the output 3 of the waveguide 20 remain substantially identical for given dimensions of the guide. By way of example, the ratio between the currents injected in the various regions is such that the current is weaker at input 5 and output 3 of the component (for example of the order of 40 to 60 mA) by comparison with guiding branch 1 (in which it is for instance of the order of 180 to 200 mA).

As an embodiment of an all-active wavelength shifter with a small number of independent electrodes, the invention provides for example connecting the three electrodes $E_1$, $E_5$ and $E_3$ covering these three regions 1, 5 and 3. Since the component is symmetrical, it is of course possible in a variant to connect the electrodes $E_2$, $E_5$ and $E_3$ respectively covering the second guiding branch 2, the input 5 and the output 3.

However, when connecting these three electrodes to form a single common electrode, attention must be given to preserving the proportions between the carrier densities circulating in the various regions covered. The other two electrodes $E_2$ (or $E_1$ depending on the variant) and $E_4$ are in turn kept independent to allow control of the functioning of the component.

Figure 2:
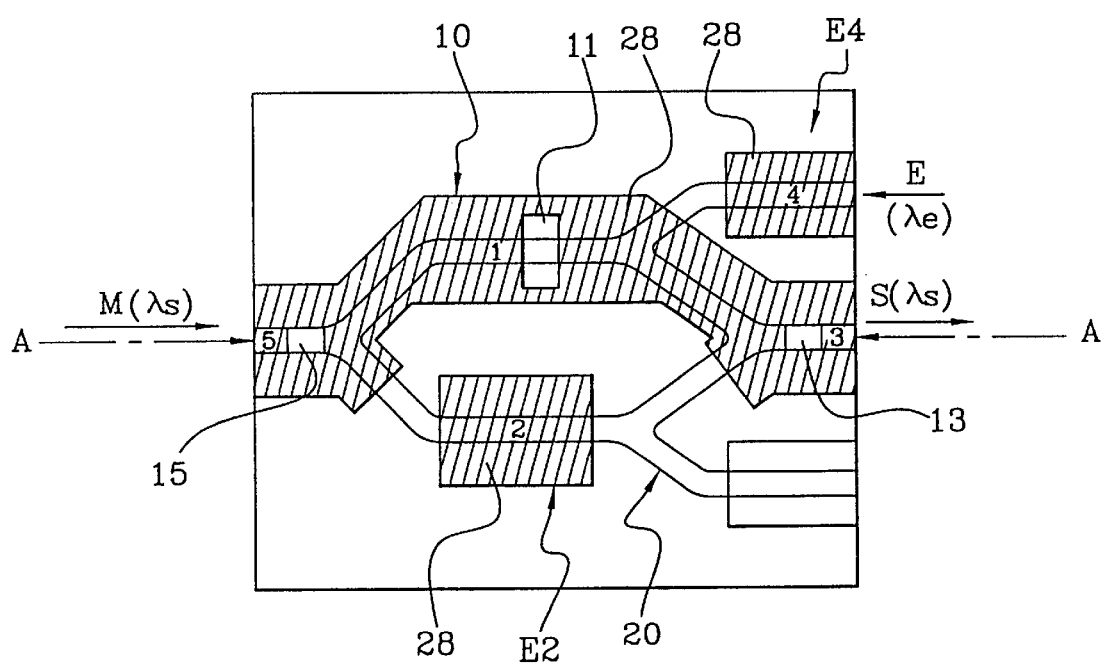
Figure 3:
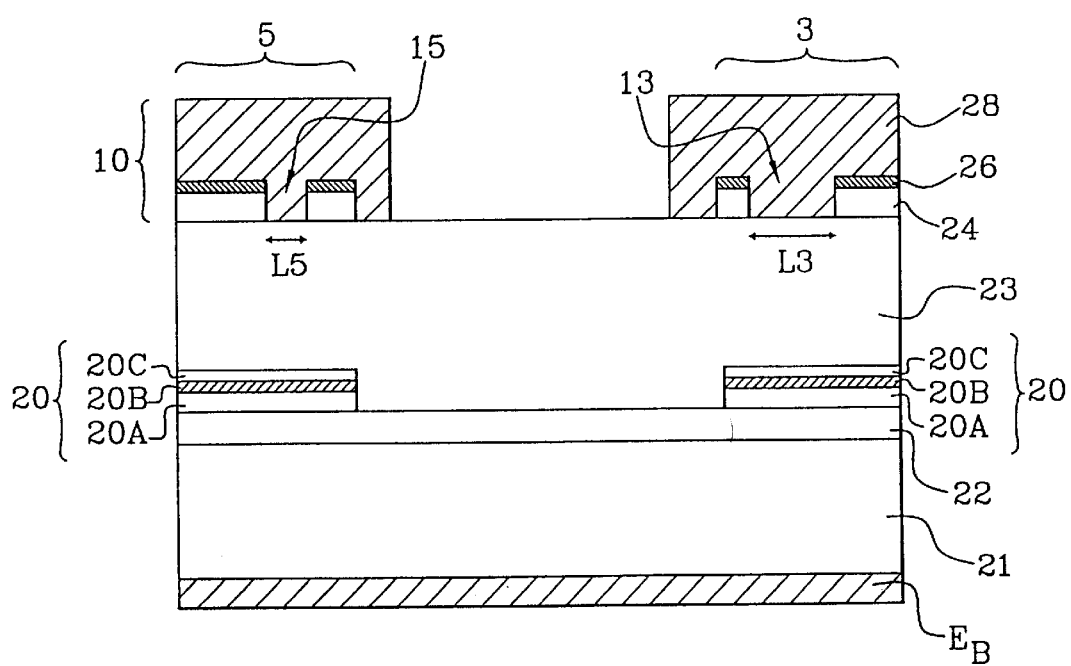

An example of an embodiment of an all-active wavelength shifter according to the present invention will be better understood when making reference to FIGS. 2 and 3 which respectively give a diagrammatic representation of it in plan and in longitudinal section A—A.

The shifter according to the invention has three independent electrodes as against five in the prior art. One of these electrodes, referenced 10 in FIG. 2 and referred to hereinafter as the common electrode, specifically covers the three regions corresponding to the guiding branch 1, the input 5 and the output 3. The embodiment is such that it has a distributed transverse resistivity which is adjusted depending on the region under consideration. Adjusting the transverse resistivity in the various regions makes it possible, for a given applied voltage, to modify the value of current density in each of these regions. Consequently, an adjustment of the transverse resistivity in different zones of the common electrode 10, corresponding to the different regions covered, makes it possible to preserve the proportions between the current densities circulating in the said regions of the active waveguide 20.

FIG. 3, which shows a longitudinal section A—A of the component shown in FIG. 2, is a more detailed illustration of the vertical structure of the component as well as an embodiment of the common electrode 10 covering the regions 1, 5 and 3.

Conventionally, the structure of this shifter is constituted successively, from the bottom upwards, of lower electrodes, a substrate 21, a lower buffer layer 22, an active layer 20, an upper buffer layer 23, and upper electrodes. In FIG. 3 only the large electrode 10 common to the three regions covered is visible, as well as a large lower electrode $E_B$ opposite the common electrode 10. In addition, only two of the regions 3 and 5 covered by the common electrode 10 are visible in this FIG. 3.

The stacking on the substrate 21 of the various layers 22, 20, 23 and 24 is carried out by a well-known epitaxy method such as for instance molecular beam epitaxy ("MBE").

According to an embodiment, the optical component can be made on a substrate 21 of type III–V material, such as for instance indium phosphide InP with a buried guide structure.

The substrate is also doped with carriers of a first type, for example with type n carriers. According to another embodiment, the lower buffer layer 22 can be made in InP and is doped with carriers of the first type (type n carriers for instance).

The buried guide 20 may for example consist successively of:

a non-doped quaternary InGaAsP lower confinement layer 20A the composition of which is selected to have a characteristic wavelength (gap wavelength) equal to 1.18 μm, a non-doped quaternary InGaAsP active layer 20B the composition of which is selected to have a characteristic wavelength (gap wavelength) equal to 1.55 μm, a non-doped quaternary InGaAsP confinement layer 20C the composition of which is selected to have a characteristic wavelength (gap wavelength) equal to 1.18 μm.

The upper buffer layer 23 is made in the same material as the lower buffer layer, i.e. in InP in the above example, and is doped with carriers of a second type (i.e. with p carriers in the example).

The buried guide 20 has for example a width of 1.2 µm so as to ensure a single-mode function for the wavelengths currently used in optical communications.

The upper electrodes are conventionally constituted of a contact layer 24 on which is deposited at least one metallization layer 28. The contact layer 24 is for example made in a ternary material, such as InGaAs, and strongly doped with carriers of the second type (i.e. with type p carriers for example). This contact layer 24 is deposited on the whole surface of the optical component.

After this contact layer 24 has been deposited, a metallic mask 26 is formed on it, constituted of titanium or tungsten for example, using any conventional method well-known to those skilled in the art. This mask 26 is defined not only to enable the making of the various independent electrodes necessary to the functioning of the component, but also to enable the making of the adjustment of the transverse resistivity in different zones of the common electrode 10. The contact layer is therefore engraved through the metal mask 26 to obtain contact sectors separated by engraved zones. Some of these sectors define the contact sectors of the control electrodes $E_2$ and $E_4$ (FIG. 2), while other sectors allow adjustment of the transverse resistivity in different zones of the common electrode 10. The engraving method used is for example a reactive ion engraving method ("RIE"). Possible annealing (at 550° C. in the case of an InP substrate for example) then makes it possible to reduce the resistivity at the border between the contact layer 24 and the mask metal 26.

Finally, after making another mask using a conventional method well-known to those skilled in the art, a metallization layer 28 is deposited to define the different electrodes 10, $E_2$ and $E_4$ of the component. This second metallization layer is for example composed of a succession of layers of titanium, platinum and gold, deposited by a known method of vacuum evaporation. The metallization layer 28 of the common electrode 10 advantageously forms a single point of contact on this electrode.

The transverse resistivity of the common electrode 10, is adjusted in different zones corresponding to the regions 1, 3 and 5 covered, thanks to the presence of the local interruptions in the contact layer 24. These local interruptions are referenced 11, 13 and 15 in FIGS. 2 and 3. They are also made over a width at least equal to that of the active waveguide 20.

In FIGS. 2 and 3, only one local interruption 11, 13 and 15 has been shown respectively in regions 1, 3 and 5. However, it is quite possible to consider making no local interruptions or more than one local interruption above at least one particular region.

In a varying embodiment, it is also possible to engrave locally the second metallization layer 28 over a width at least identical to that of the waveguide but less than that of the electrode 10 in order to retain a single point of contact. These interruptions of the metalization 28 in the various zones of the common electrode 10 are diagrammatically represented in FIG. 2 and also referenced 11, 13 and 15.

Locally engraving the metallic layer 28 and the contact layer 24 of the common electrode 10 makes it possible to increase resistivity in the zones situated under the interruptions 11, 13 and 15.

These local interruptions of the contact layer 24 and, if any, of the metallization layer 28 are made over lengths $L_3$, $L_5$ (FIG. 3) which can be determined by those skilled in the art depending on the values of current density to be obtained in the corresponding regions of the waveguide 20.

In another embodiment, the transverse resistivity of the common electrode 10 can be locally adjusted, in the zones corresponding to the regions covered, by locally modifying the doping of the contact layer 24. It should be noted that in this example the contact layer is doped with carriers of type p. The local modification of the doping of this contact layer 24 can be made for example by means of an ion implantation method. It is also made over a width at least identical to that of the waveguide 20 and over a length which will be determined by those skilled in the art depending on the current density which must be obtained in the region under consideration.

The two other independent electrodes $E_4$ and $E_2$ (FIG. 2), situated respectively on an input region 4 and on a region 2 corresponding to the second guiding branch of the component, allow control of the functioning of the component. The electrode $E_4$ of the input amplifier $SOA_4$ allows specifically control of the amplification of the input signal E. The electrode $E_2$ allows correction of the level of amplification in the second branch as compared with the level of amplification in the first guiding branch, in order to maintain substantially the same level of amplification in the two branches of the structure.

The metallization layer 28 which forms the single point of contact of the common electrode 10 to the three regions 1, 3 and 5, allows injection of a current derived from a single current source. The density of the current circulating in the waveguide 20 situated below this common electrode is then modified, depending on the regions of the waveguide, due to the fact that the value of the transverse resistivity of this electrode is locally adjusted depending on the said regions under consideration. This embodiment of a wavelength shifter thus makes it possible to respect the proportions between the current densities circulating in the different regions of the waveguide 20. This is because the current density, in this type of component, must be less in regions 5 and 3, situated at input and output, than in the region of the guiding branch 1. The number of independent electrodes is thus reduced, but the functioning remains identical to that of conventional all-active wavelength shifters.

The invention does not apply only to all-active wavelength shifters. In general terms, it applies to all all-active optical components based on a number of semi-conductor optical amplifiers.

The invention can also be applied to components with an active-passive structure, although this case is less frequent. This is because in this case most of the semi-conductor optical amplifiers used are needed to control the functioning of the component and cannot therefore be connected.

Thanks to the invention, it is therefore possible to reduce the number of independent electrodes in an all-active optical component. This reduction in the number of electrodes results in a reduction in the number of current sources necessary to make the component function and consequently in a cost reduction. The use of such a component and its insertion into an optical telecommunication system are thus facilitated by it. Furthermore, the invention does not involve an additional stage in the manufacturing method, since the local interruptions in the common electrode can be made by engraving, at the time of configuration of the upper electrodes.

What is claimed is:

1. A semi-conductor optical component, having different regions (1, 2, 3, 4, 5) with the same vertical structure, wherein an active waveguide (20) is buried between the lower (22) and upper (23) buffer layers, said regions having lower and upper electrodes (10, $E_2$, $E_4$) for the purpose of injecting into them equal or different values of current density, characterized in that at least one (10) of the said electrodes covers a number of regions (1, 3, 5) and has distributed transverse resistivity which is adjusted depending on the region under consideration.

2. A component according to claim 1, characterized in that the upper electrodes (10, $E_2$, $E_4$) are constituted by a contact layer (24) on which is deposited a metallization layer (28), and in that the transverse resistivity of the electrode (10) which is common to a number of regions (1, 3, 5) is adjusted, depending on the region under consideration, by local interruption of the contact layer (24).

3. A component according to claim 2, characterized in that the local interruptions (11, 13, 15) of the contact layer (24) are made by engraving, over a width at least identical to that of the active waveguide (20).

4. A component according to one of claim 1, characterized in that the metallization layer (28) of the common electrode (10) is in addition interrupted locally, by engraving (11, 13, 15), over a width at least identical to that of the active waveguide (20) and less than that of the said common electrode (10).

5. A component according to claim 1, characterized in that the upper electrodes (10, $E_2$, $E_4$) are constituted by a doped contact layer (24), on which is deposited a metallization layer (28), and in that the transverse resistivity of the electrode (10) common to a number of regions (1, 3, 5) is adjusted, depending on the region under consideration, by local modification of the doping of the contact layer (24).

6. A component according to claim 5, characterized in that the doping of the contact layer (24) is locally modified by ion implantation, over a width at least identical to that of the active waveguide (20).

7. A component according to claim 1, characterized in that it constitutes an all-active wavelength shifter.

8. A component according to claim 7, characterized in that it has an electrode (10), common to a guiding branch (1), to an input (5) and to an output (3); and two control electrodes ($E_2$, $E_4$) covering respectively another guiding branch (2) and another input (4).

* * * * *